(12) United States Patent
Jain et al.

(10) Patent No.: US 6,627,969 B1
(45) Date of Patent: Sep. 30, 2003

(54) METAL-TO-METAL ANTIFUSE HAVING IMPROVED BARRIER LAYER

(75) Inventors: Rajiv Jain, Palo Alto, CA (US); Andre Stolmeijer, Washougal, WA (US); Mehul D. Shroff, Cupertino, CA (US)

(73) Assignee: QuickLasic Corporation, Sunnyvale, CA (US)

( * ) Notice: Subject to any disclaimer, the term of this patent is extended or adjusted under 35 U.S.C. 154(b) by 0 days.

(21) Appl. No.: 09/563,091

(22) Filed: May 1, 2000

Related U.S. Application Data

(62) Division of application No. 09/133,998, filed on Aug. 13, 1998, now Pat. No. 6,107,165.

(51) Int. Cl.$^7$ .............................................. H01L 29/00
(52) U.S. Cl. ...................... 257/530; 257/529; 257/209
(58) Field of Search ................................ 257/530, 529, 257/209; 438/467

(56) References Cited

U.S. PATENT DOCUMENTS

| | | |
|---|---|---|
| 4,823,181 A | 4/1989 | Mohsen et al. |
| 4,873,459 A | 10/1989 | El Gamal et al. |
| 4,876,220 A | 10/1989 | Mohsen et al. |
| 4,943,538 A | 7/1990 | Mohsen et al. |
| 5,055,718 A | 10/1991 | Galbraith et al. |
| 5,057,451 A | 10/1991 | McCollum |
| 5,070,384 A | 12/1991 | McCollum et al. |
| 5,087,958 A | 2/1992 | Chen et al. |
| 5,122,685 A | 6/1992 | Chan et al. |
| 5,130,777 A | 7/1992 | Galbraith et al. |

(List continued on next page.)

FOREIGN PATENT DOCUMENTS

GB    2086 654 A    5/1982

OTHER PUBLICATIONS

S. Brown, et al., "Field Programmable Gate Arrays", pp. 1–43 and 88–202 (1992).
Actel FPGA Data Book and Design Guide, pp. ii through 7–8 (1996).
QuickLogic Data Book 1996/97, pp. i through 6–36.
Actel 54SX Family FPGAs, pp. 1 through 35 (Mar. 1998).

*Primary Examiner*—Phat X. Cao
(74) *Attorney, Agent, or Firm*—Silicon Valley Patent Group LLP; Michael J. Hulbert

(57) ABSTRACT

A metal-to-metal conductive plug-type antifuse has a conductive plug disposed in an opening in an insulating layer. A programmable material feature (for example, amorphous silicon) overlies the conductive plug. A conductor involving a metal (for example, aluminum or copper) that migrates in the programmable material overlies the programmable material. To prevent migration of metal from the conductor into the programmable material when the antifuse is not programmed, the conductor has a layer of barrier metal between the metal that migrates and the programmable material. In some embodiments, there are two layers of barrier metal. An airbreak after formation of the first barrier metal layer improves the ability of the barrier metal to prevent diffusion between the programmable material and the overlying conductor. The airbreak may stuff grain boundaries in the upper surface of the first barrier metal and/or may cause the first barrier metal layer to have different grains and/or a different grain orientation than the overlaying second barrier metal layer. In some embodiments, a capping layer over the top surface of the programmable material protects the underlying programmable material during an ashing step when a mask used to etch the programmable material is removed. The capping layer and the programmable material form a capping layer/programmable material layer stack within the antifuse underneath the two barrier metal layers. The capping layer may also be made of a barrier metal and constitute an additional barrier.

13 Claims, 3 Drawing Sheets

U.S. PATENT DOCUMENTS

| | | |
|---|---|---|
| 5,134,457 A | 7/1992 | Hamdy et al. |
| 5,163,180 A | 11/1992 | Eltoukhy et al. |
| 5,171,715 A | 12/1992 | Husher et al. |
| 5,196,724 A | 3/1993 | Gordon et al. |
| 5,233,217 A | 8/1993 | Dixit et al. |
| 5,308,795 A * | 5/1994 | Hawley et al. ............ 438/467 |
| 5,362,676 A | 11/1994 | Gordon et al. |
| 5,373,169 A | 12/1994 | McCollum et al. |
| 5,387,812 A * | 2/1995 | Forouhi et al. ............ 257/530 |
| 5,404,029 A | 4/1995 | Husher et al. |
| 5,411,917 A | 5/1995 | Forouhi et al. |
| 5,412,244 A | 5/1995 | Hamdy et al. |
| 5,424,655 A | 6/1995 | Chua |
| 5,449,947 A | 9/1995 | Chen et al. |
| 5,464,790 A | 11/1995 | Hawley |
| 5,486,707 A * | 1/1996 | Look et al. ............ 257/530 |
| 5,495,181 A | 2/1996 | Kolze |
| 5,498,895 A | 3/1996 | Chen |
| 5,502,315 A | 3/1996 | Chua et al. |
| 5,510,646 A | 4/1996 | Forouhi et al. |
| 5,519,248 A | 5/1996 | Yan et al. |
| 5,557,136 A | 9/1996 | Gordon et al. |
| 5,592,016 A | 1/1997 | Go et al. |
| 5,619,063 A | 4/1997 | Chen et al. |
| 5,663,091 A | 9/1997 | Yen et al. |
| 5,670,403 A | 9/1997 | Chen |
| 5,701,027 A | 12/1997 | Gordon et al. |
| 5,753,528 A * | 5/1998 | Forouhi et al. ............ 438/467 |
| 5,763,299 A | 6/1998 | McCollum et al. |
| 5,763,898 A | 6/1998 | Forouhi et al. |
| 5,920,109 A | 7/1999 | Hawley et al. |
| 5,970,372 A * | 10/1999 | Hart et al. ............ 438/600 |
| 6,016,001 A * | 1/2000 | Sanchez et al. ............ 257/530 |

\* cited by examiner

METAL-TO-METAL ANTIFUSE HAVING IMPROVED BARRIER LAYER

CROSS REFERENCE TO RELATED APPLICATION

This application is a divisional of U.S. application Ser. No. 09/133,998 filed Aug. 13, 1998, now U.S. Pat. No. 6,107,165.

BACKGROUND INFORMATION

FIG. 1 (Prior Art) is a cross-sectional diagram of a conventional conductive plug-type antifuse 110 as disclosed in U.S. Pat. No. 5,308,795. A first conductor 114 is disposed on an insulating underlying layer 112. First metal conductor 114 may comprise a sandwich structure of a lower barrier metal layer (for example, TiW), an aluminum layer (for example, AlSiCu), and an upper barrier layer (for example, TiW). Layer 116 is a layer of dielectric (for example, PECVD silicon dioxide). A conductive plug is disposed in an opening 118 in layer 116 and includes a conductive material 120 (for example, TiW) and a planarizing material 122 (for example, spin-on glass). Layer 124 is a layer of antifuse material (for example, a single layer of amorphous silicon). A capping layer 126 (for example, TiW or TiN) is provided on antifuse material layer 124 to prevent contamination of the antifuse layer from atoms in an overlying second metal conductor. Oxide spacers 128 are provided in order to minimize step coverage problems for the overlying second metal conductor 130.

When unprogrammed, the first conductor 114 is not coupled to the second conductor 130 through the antifuse 110. When programmed, however, antifuse 110 forms a permanent electrical connection between the first conductor 114 and the second conductor 130.

It is desired to improve such an antifuse.

SUMMARY

A metal-to-metal conductive plug-type antifuse has a conductive plug disposed in an opening in an insulating layer. A layer of a programmable material (for example, amorphous silicon) overlies the conductive plug. A conductor involving a metal (for example, aluminum or copper) that migrates in the programmable material overlies the programmable material. The antifuse is programmed by forming a connection through the layer of programmable material such that the conductive plug is connected to the overlying conductor.

To prevent migration of metal from the conductor into the programmable material when the antifuse is not programmed, the conductor has a layer of barrier metal between the metal that migrates and the programmable material. In some embodiments, there are two layers of barrier metal. An airbreak after formation of the first barrier metal layer causes an improvement in the barrier properties of the first barrier metal layer. This airbreak may cause grain boundaries in the upper surface of the first barrier metal layer to be stuffed and/or may cause the upper barrier metal layer to be formed with different grains or a different grain orientation than the lower barrier metal layer. In some embodiments, a capping layer over the top surface of the programmable material protects the underlying programmable material during an ashing step when a mask used to etch the programmable material is removed. The capping layer and the programmable material form a capping layer/ programmable material layer stack within the antifuse underneath the two barrier metal layers. The capping layer may also be made of a barrier metal and constitute an additional barrier.

This summary does not purport to define the invention. The invention is defined by the claims.

DETAILED DESCRIPTION OF THE PREFERRED EMBODIMENTS

Figure 1:
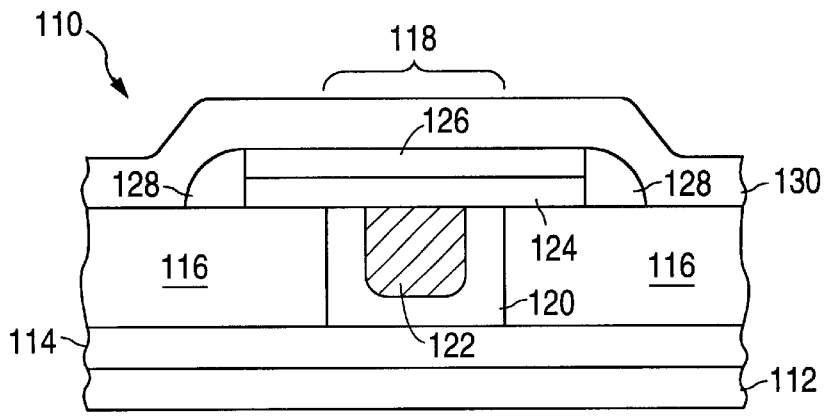
FIG. 1 (Prior Art) is a cross-sectional diagram of a conventional antifuse from U.S. Pat. No. 5,308,795.

A field programmable gate array has a metal-to-metal conductive plug-type antifuse. For background information on antifuses, see U.S. Pat. Nos.: 5,502,315, 5,362,676, 5,557,136, 5,243,226, 5,302,546 and 5,661,412 (the subject matter of these patents is incorporated herein by reference). Antifuses can be fabricated in accordance with techniques set forth in the U.S. Patent Application entitled "Programmable Device Having Antifuses Without Programmable Material Edges And/Or Corners Underneath Metal", by Mehul Shroff et al., U.S. Ser. No. 09/133,999, filed Aug. 13, 1998 (the subject matter of this application is incorporated herein by reference).

The metal-to-metal conductive plug-type antifuse is fabricated as follows. An insulating layer is deposited on an underlying structure. In some embodiments, the underlying structure includes logic transistors of a field programmable gate array. The insulating layer may be a layer of PECVD (plasma enhanced chemical vapor deposited) TEOS (tetra ethyl ortho silicate) about 10,000 angstroms thick. Three different types of TEOS may be deposited sequentially in three different layers in order to fill spaces between metal lines of underlying circuitry.

Next, a first conductor (for example, a row or column signal conductor of a field programmable gate array) is fabricated. The first conductor involves a first barrier metal layer, an intervening aluminum (for example, AlSiCu) layer disposed over the first barrier metal layer, and a second barrier metal layer disposed over the aluminum layer.

In one embodiment, a first barrier metal layer of about 1000 angstroms of titanium nitride is sputtered onto the TEOS insulating layer. A Centura sputtering machine manufactured by Applied Materials is employed. After the forming of this titanium nitride layer, a cleaning step is performed in a single wafer high energy deionized water cleaning machine to remove loose particles that may remain after titanium nitride sputtering. Next, a layer comprising aluminum (for example, AlSiCu) is sputtered onto the first barrier metal layer using the same sputtering machine but a different sputter target. This layer comprises about one to two percent copper and is about 4000 angstroms thick. Next, a second barrier metal layer of about 1400 angstroms titanium nitride is sputtered onto the layer comprising aluminum using the same technique as was used to form the first barrier metal layer. In some embodiments, the titanium nitride layer can be deposited by chemical vapor deposition.

Next, after a photoresist mask is formed on the metal surface, a dry plasma RIE (reactive ion etch) etching step is performed to pattern the metal layers and thereby form the first conductor. The photoresist mask is then removed in a photoresist stripping step.

Next, an insulating layer of TEOS (called an interlayer dielectric layer) 10,000 angstroms thick is deposited on the underlying structure including the first conductor. The TEOS is deposited using the same three layer technique as was used to deposit the first TEOS layer. A chemical mechanical polishing (CMP) step is performed so that the top surface of the TEOS is substantially planar.

Figure 2:
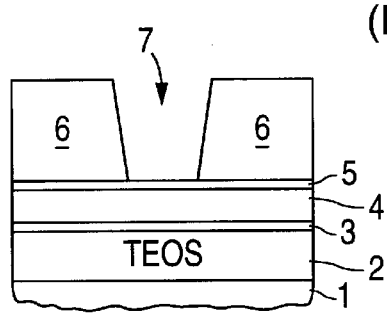
FIGS. 2–6, 8, 9 and 11–18 are cross-sectional diagrams of an antifuse structure in accordance with an embodiment of the present invention.

Next, after a photoresist mask is formed on the TEOS surface, an RIE etch step is performed to form a 0.5 micron by 0.5 micron opening in the TEOS layer. This opening extends all the way through the TEOS layer and down to the underlying metal layer. The opening may extend into the top of the second barrier metal layer of the first conductor by up to about 700 angstroms. The resulting structure is illustrated in cross-section in FIG. 2.

Layer 1 is the underlying structure which may involve logic circuitry of a field programmable gate array or be connected to such circuitry. Layer 2 is the first TEOS layer. Layer 3 is the first barrier metal layer. Layer 4 is the intervening layer that comprises aluminum. Layer 5 is the second barrier metal layer. Layer 6 is the second TEOS layer having the opening 7.

Figure 3:
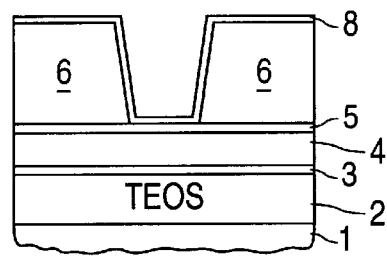

Next, an adhesion promoting layer 8 is formed on the inside TEOS surface of opening 7. Adhesion layer 8 promotes adhesion of a subsequently deposited tungsten to the sidewall of opening 7. In one embodiment, adhesion promoting layer 8 is a titanium nitride layer approximately 1000 angstroms thick. After deposition of the titanium nitride layer, a titanium nitride cleaning step is performed as discussed above in connection with the previous titanium nitride layer. A cross-section of the resulting structure is illustrated in FIG. 3.

Figure 4:
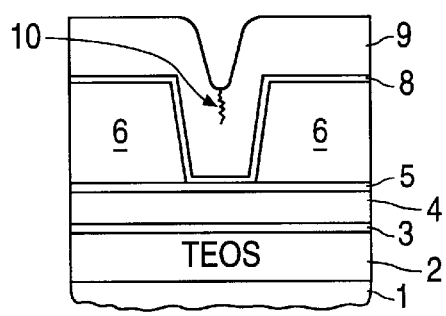
Figure 8:
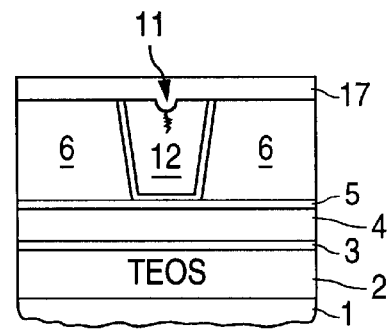

Next, a layer of tungsten 9 about 5000 angstroms thick is PECVD deposited to fill opening 7. During this deposition, a seam or region 10 of weak tungsten may also form. A cross-section of the resulting structure is illustrated in FIG. 4.

Figure 5:
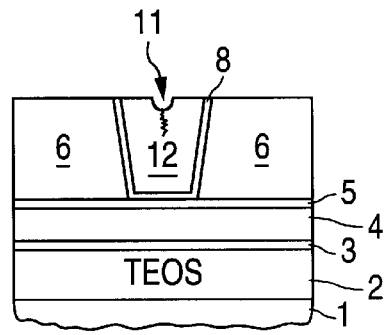

Next, a chemical mechanical polishing (CMP) step is performed to remove the tungsten and adhesion layer that is not disposed in opening 7. Chemical and/or mechanical action of this CMP step may expose or open up a dimple 11 in or near the center of the resulting conductive plug 12. The conductive plug 12 comprises both the tungsten plug as well as the remaining portion of the adhesion promoting layer 8. The polished top surface of the conductive plug 12 is coplanar with the polished top surface of the neighboring TEOS of the second TEOS layer. A cross-section of the resulting structure is illustrated in FIG. 5.

Figure 7:
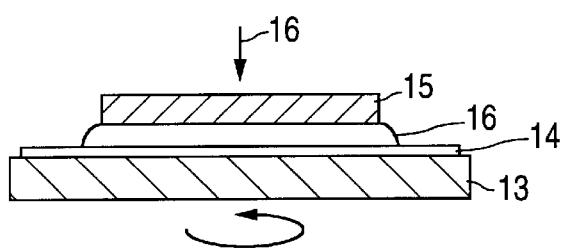
FIG. 7 is a cross-sectional diagram of a chemical mechanical polishing step used in accordance with some embodiments of the present invention.

FIG. 7 is a cross-sectional diagram illustrating a chemical mechanical polishing step. A platten 13 having a pad 14 rotates with respect to a wafer 15 such that a slurry 16 between the pad 14 and 15 polishes the wafer. Wafer 15 is disposed upside down and is pressed against the platten 13 with pressure 16 so that the top surface of the wafer having the antifuse structure is polished. The polishing step takes about two minutes. Polishing time, pressure on the wafer, slurry composition, pad type, platten rotating speed and temperature are controlled in accordance with operating specifications of the particular type of polishing machine used. A Mirra machine made by Applied Materials or a Westek machine manufactured by IPEC can be used.

Figure 6:
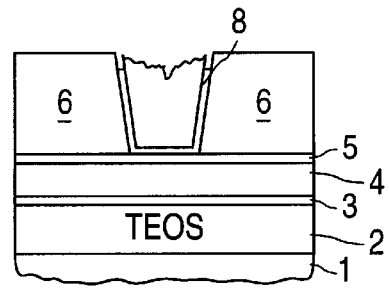

Preferably, the conductive plug 12 is not formed using a standard tungsten etch back step. FIG. 6 is a cross-sectional diagram illustrating an unfavorable structure that might result if a tungsten etch back step were employed. Portions of the adhesion promoting layer 8 are missing.

Next, the antifuse structure is cleaned to remove particles that may remain after the polishing step. Ammonia and deionized water are used in a single wafer cleaning machine manufactured by DNS.

Next, in order to fill dimple 11 in the top surface of the conductive plug, a 1000 angstrom layer 17 of TEOS is deposited.

Figure 9:
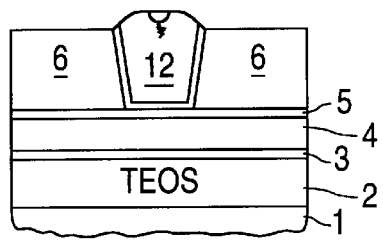

Next, a chemical mechanical polishing step is used to remove the TEOS layer 17 except for that in dimple 11. The thickness of all TEOS over the titanium nitride layer 5 is measured, chemical mechanical polishing is done, residue is removed in a cleaning step involving ammonia and deionized water, and the thickness of the TEOS on the titanium nitride layer 5 is measured again. The target TEOS removal thickness is 1750 angstroms over titanium nitride 5. With 1750 angstroms of TEOS removed, all of the upper TEOS layer 17 is removed except for that in dimple 11. The TEOS polishes faster than the tungsten metal. Consequently, the top surface of the tungsten plug protrudes slightly from the top surface of the polished TEOS surface. A cross-section of the resulting structure is illustrated in FIG. 9.

Figure 10:
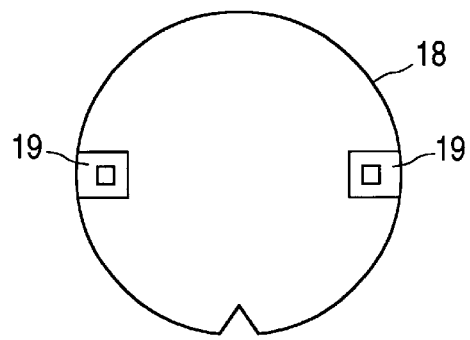
FIG. 10 is a top-down diagram of a wafer having alignment marks.

FIG. 10 is a top-down diagram of a wafer 18 having alignment marks 19. These alignment marks are used by a stepper machine to align a reticle to the wafer. In this embodiment, alignment marks 19 comprise a polysilicon/metal 1/metal 2/metal 3 stack. Processing is performed to expose the alignment marks 19. The entire wafer 18 is covered with photoresist except for the alignment marks 19, RIE etching is performed to remove all oxide on top of alignment marks 19, and the photoresist is then removed using a dry oxygen plasma strip followed by a wet strip. The dry oxygen plasma strip increases the thickness of a native oxide (not shown) on the top surface of the conductive plug 12 and/or changes the characteristics of the plug. The thickness of this native oxide may, for example, be about 10 angstroms. In some embodiments, a short pre-deposition sputter etch is done to remove this native oxide prior to subsequent processing.

Next, a layer 20 of a programmable antifuse material is deposited over the entire wafer. The programmable material may include one or more layers of antifuse dielectric materials including amorphous silicon, polysilicon, silicon nitride and silicon oxide. Dopants and other materials such as hydrogen are added in particular embodiments.

In the specific embodiment described, the programmable material is a single 700 angstrom layer of hydrogenated intrinsic PECVD amorphous silicon deposited using an Applied Materials AMP500 single chamber PEVCD deposition machine. Deposition of the programmable material occurs in two steps. In a first step, deposition occurs for about ten seconds at a relatively slow deposition rate to form a starting layer about 200 angstroms thick. In a second step, deposition occurs at a higher deposition rate for about twelve seconds.

Next, the top surface of the amorphous silicon programmable material layer 20 is exposed to oxygen and nitrogen in the form of atmospheric air by moving the wafer to a different deposition chamber. This airbreak results in a native oxide (not shown) of an estimated 10 angstroms forming on the top surface of amorphous silicon 20.

Figure 12:
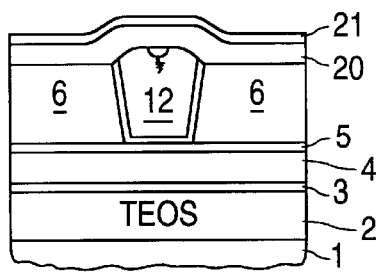

Next, a capping layer 21 is formed on the amorphous silicon layer (it is actually formed on the native oxide on the amorphous silicon layer). Capping layer 21 in this embodiment is a 250 angstrom (plus or minus 25 angstroms) layer of titanium nitride. Capping layer 21 prevents attack of the top surface of the amorphous silicon during a subsequent wet strip when the amorphous silicon layer is patterned, prevents oxidation of the top of the amorphous silicon layer during a subsequent dry strip when the amorphous silicon layer is patterned, and provides an additional barrier between the amorphous silicon and a subsequently deposited layer of aluminum. Although titanium nitride is used in the specific embodiment, other barrier materials could be used including titanium tungsten, titanium, tungsten, tungsten silicide, tantalum nitride and titanium-tungsten-nitrogen alloys. A cross-section of the resulting structure is illustrated in FIG. 12.

Next, an airbreak occurs and the structure is cleaned in the same way as described above after other titanium nitride deposition steps.

Figure 13:
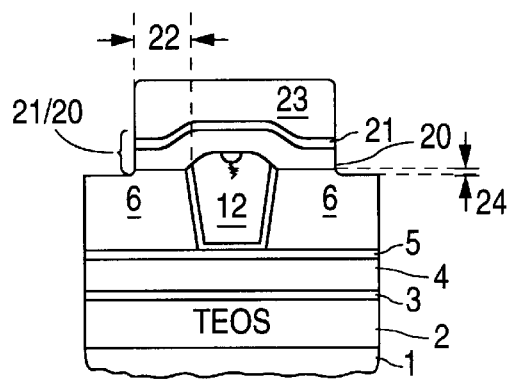
Figure 11:
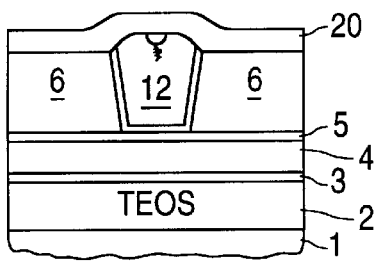
Figure 14:
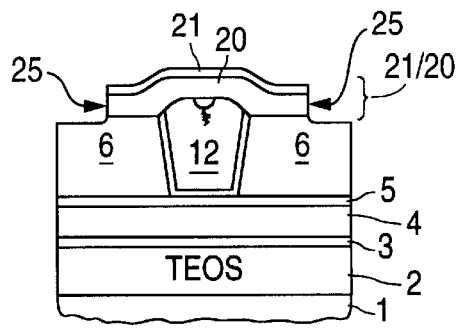

Next, the capping layer 21 and the underlying amorphous silicon programmable material layer 20 are patterned such that there is at least a 0.45 micron overlap 22 of the resulting capping layer/programmable material layer stack 21/20 over the top lateral edge of the conductive plug. Patterning is accomplished with a photoresist mask 23 and a subsequent dry plasma RIE etch of unmasked areas. The amount of vertical overetch 24 into the underlying TEOS layer 6 is tightly controlled to be the minimum amount that will remove all amorphous silicon in the area to be etched. FIG. 13 is a cross-sectional diagram of the resulting structure involving a conductive plug 12 overlaid by a capping layer/programmable material layer stack 21/20.

Next, photoresist mask 23 is removed using plasma oxygen ashing. The plasma oxygen ashing step takes about 20 seconds and occurs in an ashing chamber of the same RIE etching machine that was used to etch amorphous silicon layer 20. Sidewalls 25 of the amorphous silicon and perhaps the capping layer of the capping layer/programmable material layer stack 21/20 are oxidized in the ashing step. The oxidized sidewalls 25 are substantially vertical. Any photoresist residue remaining after the plasma oxygen ashing step is removed in a subsequent wet strip step. In some embodiments, ACT wet strip reagent is used for approximately 30 minutes. The oxidization of the sidewalls 25 during the prior ashing step serves to protect sidewalls 25 from lateral attack during this wet strip step. The oxidation also may provide an additional diffusion barrier.

Figure 15:
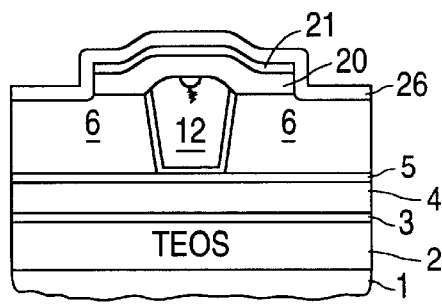

Next, a second conductor is formed that has two barrier metal layers between the top surface of the capping layer/programmable material layer stack 20/21 and an intervening aluminum layer of the second conductor. The second conductor may, for example, be a row or column signal conductor of a field programmable gate array. In one embodiment, a first barrier metal layer 26 of the second conductor is a 1000 angstrom layer of titanium nitride that is sputtered deposited. A cross-section of the resulting structure is illustrated in FIG. 15.

Next, an airbreak occurs such that the top surface of first barrier (titanium nitride) metal layer 26 is exposed to air (oxygen, nitrogen and carbon) at atmospheric pressure. Grain boundaries in the titanium nitride may be stuffed by nitrogen and/or oxygen during this airbreak. It is believed that atmospheric nitrogen stuffs grain boundaries without reacting with the titanium nitride and that atmospheric oxygen oxidizes the titanium nitride to stuff grain boundaries. An ammonia and deionized water brush cleaning step is then performed as set forth above in connection with previous titanium nitride depositions. Grain boundary stuffing could also be achieved by bleeding oxygen and/or nitrogen in during the titanium nitride deposition step. Titanium nitride barrier quality can also be improved by performing a higher temperature processing step in an atmosphere involving oxygen and/or nitrogen (for example, ashing).

Figure 16:
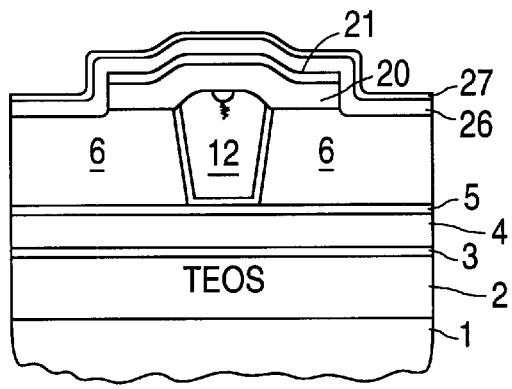

Next, a second metal barrier layer 27 is formed over the first metal barrier layer 26. In one embodiment, second metal barrier layer 27 is a sputtered titanium nitride layer about 250 angstroms thick. The airbreak prior to the deposition of layer 27 may serve to cause the metal of layer 27 to be deposited with a different grain orientation than the underlying metal of layer 26. The different grain orientations may result in a better barrier to aluminum migration. The structure formed is illustrated in cross-section in FIG. 16.

Next, an intervening metal layer 28 is formed. In one embodiment, metal layer 28 is a standard sputtered aluminum layer (AlSiCu) 8000 angstrom thick that comprises about two percent copper. Next, a third barrier metal layer 29 is formed over intervening aluminum layer 28. In one embodiment, third barrier metal layer 29 is a 250 angstrom thick titanium nitride layer. There are no airbreaks between the formations of the second barrier metal layer 27 and the overlying aluminum layer 28 or between the aluminum layer 28 and the overlying third barrier metal layer 29.

Next, metal layers 26–29 are patterned. After an airbreak, photoresist is spread over the antifuse structure and is fashioned into a mask. The metal layers 26–29 are then etched in a plasma RIE dry etch as explained above in connection with the etching of layers 3–5. A TCP 9600 model etcher made by Lam Research can be employed. Metal layers 26–29 may, for example, be patterned into a row conductor or a column conductor of an FPGA.

Next, the photoresist mask used to pattern metal layers 26–29 is removed as explained above in connection with the removal of mask 23. A plasma oxygen ashing step removes the photoresist and a subsequent wet strip removes any residue.

Next, a layer of passivation (not shown) is formed over the antifuse structure. In one embodiment, there are three layers of passivation: 1) a 1500 angstroms thick layer of PECVD deposited oxynitride passivation, 2) a 3000 angstrom thick layer of spin on glass (SOG) that fills spaces between metal conductors, and 3) a 10,000 angstrom thick layer of PECVD silicon nitride. The bottom oxynitride layer prevents moisture from the subsequent spin on glass formation step from penetrating underlying metal layers and causing corrosion. The spin on glass is cured at 370 degrees Celsius for about 40 minutes and then at 420 degrees Celsius for about 20 minutes. Because the 420 degree Celsius curing step is the highest temperature the hydrogenated amorphous silicon programmable material experiences, the curing step likely controls the removal of hydrogen and density of dangling bonds. Care is taken not to subject the amorphous silicon to a temperature higher than this 420 degrees Celsius.

Next, passivation is removed over bonding pads on the integrated circuit of which the antifuse structure is a part. Exposure of these pads is accomplished with a photoresist mask (not shown) and a subsequent RIE dry etch. After etching, the photoresist mask is removed with an ashing step and a wet strip as described above in connection with the removal of other photoresist masks.

Next, an alloy step is performed to improve gate oxide quality and transistor characteristics. The integrated circuit may, for example, be alloyed at 410 degrees Celsius for a period of about 30 minutes.

Figure 18:
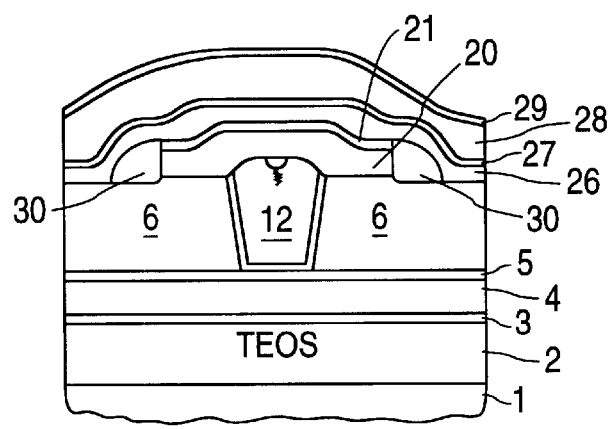

FIG. 18 is a cross-sectional diagram of an embodiment having spacers 30 around the periphery of capping layer/programmable material layer stack 20/21. In accordance with conventional technology, spacers 30 can be made of silicon oxide, silicon nitride, or another suitable material. A layer of silicon dioxide can be deposited and then etched back to leave spacers 30. For details on oxide spacers, see U.S. Pat. No. 5,362,676 (the subject matter of which is incorporated herein by reference).

Figure 17:
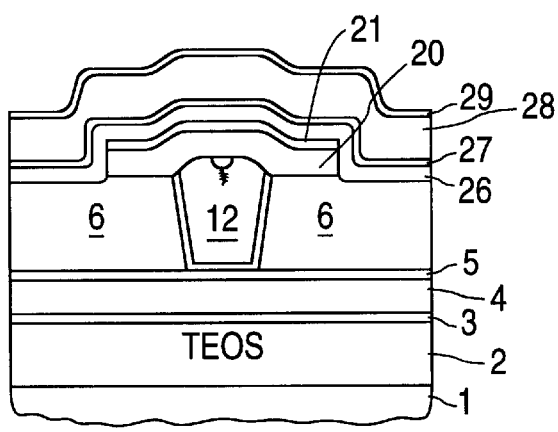

An antifuse having a structure such as is shown in FIG. 17 has an trigger voltage of about 8.3 volts when programmed in a top-down fashion (positive voltage on the top conductor with respect to the voltage on the conductive plug) and has a trigger voltage of about 9.0 volts when programmed in a bottom-up fashion (positive voltage on the conductive plug with respect to the voltage on the top conductor). When programmed top-down, metal from the conductive plug moves upward into the programmable material to form a conductive filament and when programmed bottom-up, metal from the top conductor (or the capping layer) moves downward into the programmable material to form a conductive filament. With 3.3 volts across the antifuse when in the unprogrammed state, the antifuse has a leakage current of approximately 1.0 nanoampere or less (an unprogrammed resistance of approximately 3.0 gigaohms or more). After programming, the antifuse has a resistance of approximately 40 ohms or less.

Although the invention is described in connection with certain specific embodiments for instructional purposes, the invention is not limited to the specific embodiments. Programmable materials other than amorphous silicon can be employed in accordance with the invention. Antifuses can be disposed between first layer metal and second layer metal, between second layer metal and third layer metal, between third layer metal and fourth layer metal, and/or between other layers of metal. A conductive plug can extend out of an opening in an interlayer dielectric, can just fill the opening, or can only partially fill the opening. The conductive plug can comprise a tungsten-containing plug that fills part of the opening as well as a volume of another conductive material that fills the rest of the opening. The other conductive material may be disposed in a layer over and/or under the tungsten-containing plug. In some embodiments, metal of the metal conductor disposed over the programmable material would not generally migrate in the programmable material were it not for the intervening barrier layer, but rather some of the programmable material would migrate in the metal conductor were it not for the intervening barrier layer. The terms aluminum (AlSiCu), titanium-tungsten (TiW) and titanium-nitride (TiN) refer to alloys and are not limited to require a specific stoiciometric ratio of elements. Accordingly, modifications, adaptations and combinations of various aspects of the described embodiments can be practiced without departing from the scope of the invention as set forth in the claims.

What is claimed is:

1. An antifuse structure, comprising:
    a conductive plug disposed in an opening in a dielectric layer;
    a programmable material layer feature disposed over a top surface of the conductive plug, the programmable material comprising amorphous silicon, the programmable material layer having a lateral edge;
    a first barrier metal layer disposed over the programmable material layer feature and extending beyond the lateral edge of the programmable material, wherein at least a portion of the first barrier metal layer is disposed over the dielectric layer without having the programmable material layer disposed between the first barrier metal layer and the dielectric layer, the first barrier metal layer having a top surface;
    a second barrier metal layer disposed over the top surface of the first barrier metal layer, wherein the barrier metal of the first barrier metal layer at the top surface of the first barrier metal layer has a higher concentration of at least one of oxygen and nitrogen than the barrier metal of the second barrier metal layer at the bottom surface of the second barrier metal layer; and
    a metal layer comprising one of aluminum and copper, the metal layer comprising one of aluminum and copper being disposed over and directly contacting the second barrier metal layer.

2. The antifuse of claim 1, first barrier metal layer being a layer of titanium nitride, the second barrier metal layer being a layer of titanium nitride.

3. The antifuse of claim 2, further comprising:
    a capping layer disposed between the programmable material layer feature and the first barrier metal layer, the capping layer and the programmable material layer feature forming a capping layer/programmable material layer stack.

4. The antifuse of claim 1, wherein the first barrier metal layer is at least twice as thick as the second barrier metal layer.

5. The antifuse of claim 1, wherein the dielectric layer comprises tetra ethyl ortho silicate.

6. The antifuse of claim 1, the programmable material layer feature having sidewalls, the sidewalls being oxidized, there being no deposited spacer contacting the sidewalls.

7. The antifuse of claim 1, the barrier metal of the first barrier metal layer at the top surface of the first barrier metal layer having a different grain orientation than the barrier metal of the second barrier metal layer at the bottom surface of the second barrier metal layer.

8. An antifuse, comprising:
    an amorphous silicon antifuse feature having a lateral extent;
    a conductor comprising at least one of aluminum or copper; and
    means for preventing at least one of aluminum or copper from the conductor from migrating into the amorphous silicon feature when the antifuse is in an unprogrammed state, the means comprising a first barrier metal layer that extends beyond the lateral extent of the amorphous silicon antifuse feature and comprising a second barrier metal layer disposed on and in contact with the first barrier metal layer, the second barrier metal layer extends beyond the lateral extent of the amorphous silicon antifuse, wherein the first barrier metal layer is a layer of titanium nitride having an oxygen rich upper surface.

9. The antifuse of claim 8, wherein the second barrier metal layer is a layer of titanium nitride, the means further comprising:
    a capping layer, the capping layer and the amorphous silicon antifuse feature having the same lateral extent such that the capping layer and the amorphous silicon antifuse feature form a capping layer/programming material layer stack.

10. An antifuse, comprising:
    an amorphous silicon antifuse feature having a lateral extent;

a conductor comprising at least one of aluminum or copper;

a first barrier metal layer that extends beyond the lateral extent of the amorphous silicon antifuse feature; and a second barrier metal layer disposed on and in contact with the first barrier metal layer, wherein the second barrier metal layer extends beyond the lateral extent of the amorphous silicon antifuse, and wherein the first and second barrier metal layers prevent at least one of aluminum or copper from the conductor from migrating into the amorphous silicon feature when the antifuse is in an unprogrammed state, wherein the first barrier metal layer is a layer of titanium nitride having an oxygen rich upper surface.

11. The antifuse of claim 10, wherein the second barrier metal layer is a layer of titanium nitride, and further comprising:

a capping layer, the capping layer and the amorphous silicon antifuse feature having the same lateral extent such that the capping layer and the amorphous silicon antifuse feature form a capping layer/programming material layer stack.

12. An antifuse, comprising:

an amorphous silicon antifuse feature having a lateral extent;

a conductor comprising at least one of aluminum or copper;

a first barrier metal layer that extends beyond the lateral extent of the amorphous silicon antifuse feature; and a second barrier metal layer disposed on and in contact with the first barrier metal layer, and wherein the second barrier metal layer extends beyond the lateral extent of the amorphous silicon antifuse, whereby the barrier metal layers prevent at least one of aluminum or copper from the conductor from migrating into the amorphous silicon when the antifuse is in an unprogrammed state, wherein the first barrier metal layer is a layer of titanium nitride having an oxygen rich upper surface.

13. The antifuse of claim 12, wherein the second barrier metal layer is a layer of titanium nitride, and further comprising:

a capping layer, the capping layer and the amorphous silicon antifuse feature having the same lateral extent such that the capping layer and the amorphous silicon antifuse feature form a capping layer/programming material layer stack.

* * * * *